(12) United States Patent
Yang et al.

(10) Patent No.: US 10,470,299 B2
(45) Date of Patent: Nov. 5, 2019

(54) POWER SIGNAL TRANSMISSION STRUCTURE AND DESIGN METHOD THEREOF

(71) Applicant: PEGATRON CORPORATION, Taipei (TW)

(72) Inventors: Ching Ou Yang, Taipei (TW); Cheng-Hui Chu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 15/934,897

(22) Filed: Mar. 23, 2018

(65) Prior Publication Data

US 2018/0302978 A1 Oct. 18, 2018

(30) Foreign Application Priority Data

Apr. 14, 2017 (TW) .............................. 106112493 A

(51) Int. Cl.
*H05K 1/02* (2006.01)
*H05K 1/09* (2006.01)
(Continued)

(52) U.S. Cl.
CPC ......... *H05K 1/0263* (2013.01); *H05K 1/0265* (2013.01); *H05K 1/114* (2013.01);
(Continued)

(58) Field of Classification Search
CPC ... H05K 1/02; H05K 1/09; H05K 1/11; H05K 1/14; H05K 1/16; H05K 1/18; H05K 3/12; H05K 3/22; H01L 23/48; H01L 23/498
(Continued)

(56) References Cited

U.S. PATENT DOCUMENTS

| | | | | |
|---|---|---|---|---|
| 5,618,185 A | * | 4/1997 | Aekins | H01R 31/065 174/34 |
| 2003/0047356 A1 | * | 3/2003 | Searls | H01L 23/49838 174/262 |
| 2004/0184248 A1 | * | 9/2004 | Alger | H05K 1/141 361/777 |
| 2004/0207989 A1 | * | 10/2004 | Fauh | H05K 1/0265 361/780 |

(Continued)

FOREIGN PATENT DOCUMENTS

| | | |
|---|---|---|
| JP | 2015146382 | 8/2015 |
| TW | 201206259 | 2/2012 |
| TW | 201223359 | 6/2012 |

OTHER PUBLICATIONS

"Search Report of Europe Counterpart Application", dated Sep. 12, 2018, p. 1-p. 23.

*Primary Examiner* — Xiaoliang Chen
(74) *Attorney, Agent, or Firm* — J.C. Patents

(57) ABSTRACT

A power signal transmission structure and a design method are provided. The power supply signal transmission structure is adapted for a circuit board having a first surface and a second surface opposite to the first surface, and the power signal transmission structure includes a first power electrode, a second power electrode, and a plurality of vias. The first power electrode is disposed on the first surface and has a plurality of power pad regions for receiving a power signal. The second power electrode is disposed on the second surface. The vias penetrate the circuit board to electrically connect the first power electrode and the second power electrode. The vias are arranged in accordance with the current direction of the power signal to balance the current received by the vias.

3 Claims, 7 Drawing Sheets

(51) Int. Cl.
*H05K 1/11* (2006.01)
*H05K 1/14* (2006.01)
*H05K 1/16* (2006.01)
*H05K 1/18* (2006.01)
*H05K 3/12* (2006.01)
*H05K 3/22* (2006.01)
*H01L 23/48* (2006.01)
*H01L 23/498* (2006.01)

(52) U.S. Cl.
CPC ........ *H05K 1/116* (2013.01); *H05K 2201/093* (2013.01); *H05K 2201/0969* (2013.01); *H05K 2201/0979* (2013.01); *H05K 2201/09254* (2013.01); *H05K 2201/09309* (2013.01); *H05K 2201/09409* (2013.01); *H05K 2201/09427* (2013.01); *H05K 2201/09463* (2013.01); *H05K 2201/09609* (2013.01); *H05K 2201/09618* (2013.01); *H05K 2201/09709* (2013.01)

(58) Field of Classification Search
USPC ........ 174/260, 250, 257, 262; 361/760, 767, 361/774, 777, 780
See application file for complete search history.

(56) References Cited

U.S. PATENT DOCUMENTS

| | | | | |
|---|---|---|---|---|
| 2006/0050491 | A1* | 3/2006 | Hayashi | H05K 1/0231 361/760 |
| 2008/0054401 | A1* | 3/2008 | Park | H01L 23/5223 257/532 |
| 2009/0251275 | A1* | 10/2009 | Tsuda | H01L 23/5256 337/290 |
| 2012/0018199 | A1* | 1/2012 | Lai | H05K 3/3447 174/257 |
| 2012/0132461 | A1* | 5/2012 | Huang | H05K 1/0265 174/260 |
| 2012/0241207 | A1* | 9/2012 | Huang | H05K 1/025 174/262 |
| 2012/0243194 | A1* | 9/2012 | Huang | H05K 7/00 361/774 |
| 2014/0118962 | A1* | 5/2014 | Sabavat | H05K 1/0224 361/748 |
| 2014/0334121 | A1* | 11/2014 | Ito | H05K 1/0243 361/767 |
| 2015/0097431 | A1* | 4/2015 | Tan | H01L 23/645 307/31 |
| 2017/0018490 | A1* | 1/2017 | Li | H01L 23/49827 |

* cited by examiner

POWER SIGNAL TRANSMISSION STRUCTURE AND DESIGN METHOD THEREOF

CROSS-REFERENCE TO RELATED APPLICATION

This application claims the priority benefit of Taiwan application serial no. 106112493, filed on Apr. 14, 2017. The entirety of the above-mentioned patent application is hereby incorporated by reference herein and made a part of this specification.

BACKGROUND OF THE INVENTION

1. Field of the Invention

The invention relates to a signal transmission structure, and particularly relates to a power signal transmission structure and a design method thereof.

2. Description of Related Art

With the development of science and technology, the integration of electronic products has been increased. In addition, the circuit layers in circuit boards used in the electronic products have been increased from one or two layers to six layers, eight layers, or even more than ten layers. Accordingly, electronic devices can be more densely mounted on the circuit boards. Also, vias are configured on circuits, so that electrodes on respective layers of the circuit board are electrically connected correspondingly. In other words, horizontal signals are converted into vertical ones through the vias to be transmitted to another layer in the circuit board.

Taking a power electrode as an example, if a power signal is transmitted through a single via, the single via may generate heat due to currents flowing through. In addition, when a via overheats, the conductor in the via may be damaged due to the high temperature, and devices on the circuit board may be unable to function normally or even be burned out. To avoid such a circumstance, a thicker power wire may be adopted, or more vias may be disposed to increase the volume of the conductor transmitting the power signal, so as to share the current on the transmission path of the power signals. However, the current may take the shortest and closest path so some vias do not work as expected, and the current partaking of the multiple vias is affected.

SUMMARY OF THE INVENTION

One or some embodiments of the invention provide a power signal transmission structure and a design method of the power signal transmission structure capable of facilitating current sharing by multiple vias.

The power supply signal transmission structure according to an embodiment of the invention is adapted for a circuit board having a first surface and a second surface opposite to the first surface, and the power signal transmission structure includes a first power electrode, a second power electrode, and a plurality of vias. The first power electrode is disposed on the first surface and has a plurality of power pad regions for receiving a power signal. The second power electrode is disposed on the second surface. The vias penetrate the circuit board to electrically connect the first power electrode and the second power electrode. The vias are arranged in accordance with the current direction of the power signal to balance the current received by the vias.

A design method of the power signal transmission structure according to an embodiment of the invention includes the following. A current direction of the power signal received by a first power electrode through a plurality of power pad regions is detected. The first power electrode is disposed on a first surface of a circuit board. A plurality of vias is disposed based on the current direction of the power signal to balance the current received by the vias. The vias penetrate the circuit board to electrically connect the first power electrode and a second power electrode disposed on a second surface of the circuit board opposite to the first surface.

The power supply signal transmission structure according to an embodiment of the invention is adapted for a circuit board having a first surface and a second surface opposite to the first surface. The power signal transmission structure includes a first power electrode, a second power electrode, a plurality of vias, and a plurality of first conductor isolation rings. The first power electrode is disposed on the first surface and has a plurality of power pad regions for receiving a power signal. The second power electrode is disposed on the second surface. The vias penetrate the circuit board to electrically connect the first power electrode and the second power electrode. In addition, a plurality of first conductor isolation rings is disposed to the first power electrode. The first conductor isolation rings surround some of the vias based on the current direction of the power signal to balance the current received by the vias.

A design method of the power signal transmission structure according to an embodiment of the invention includes the following. A current direction of the power signal received by a first power electrode through a plurality of power pad regions is detected. The first electrode is disposed on a first surface of a circuit board. A plurality of vias is disposed. The vias penetrate the circuit board to electrically connect the first power electrode and a second power electrode disposed on a second surface of the circuit board opposite to the first surface. In addition, a plurality of first conductor isolation rings is disposed to the first power electrode based on the current direction of the power signal. The first conductor isolation rings surround some of the vias to balance the current received by the vias.

Based on the above, in the power signal transmission structure and the design method of the power signal transmission structure according to the embodiments of the invention, the vias and/or the conductor isolation rings are disposed according to the current direction of the power signal, so as to balance the current received by the vias. Thus the respective vias are able to receive the current, and the current sharing by multiple vias is thus facilitated.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
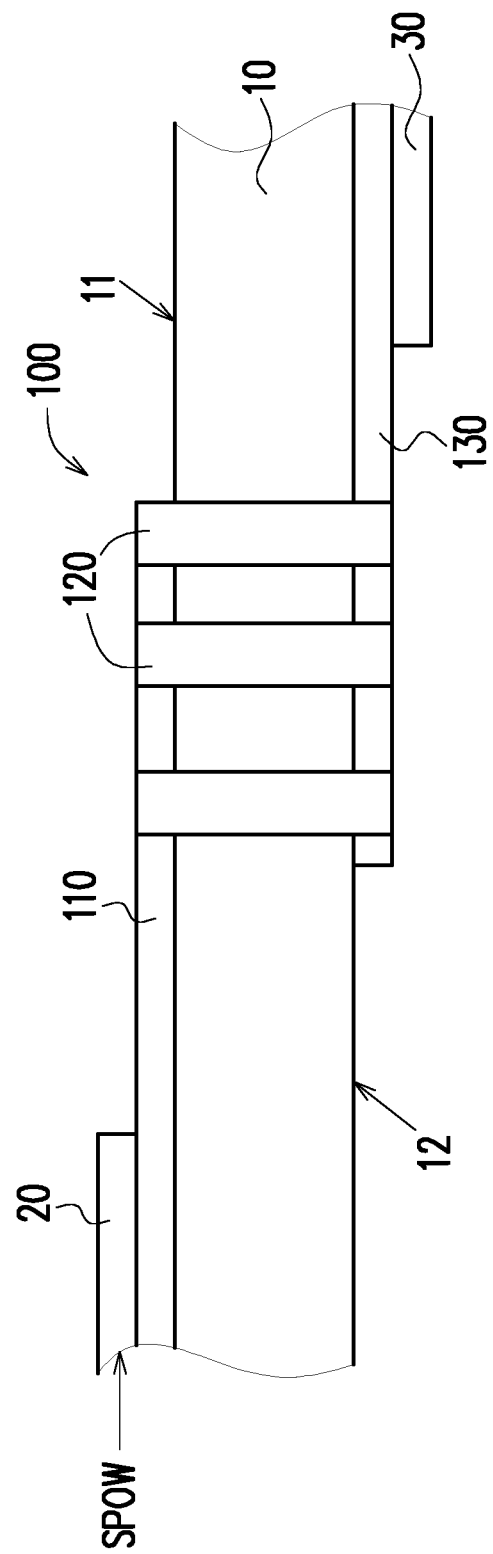
FIG. 1 is a schematic cross-sectional view of a power signal transmission structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of a power signal transmission structure according to an embodiment of the invention. Referring to FIG. 1, in the embodiment, a power signal transmission structure 100 is adapted for a circuit board 10 and includes a first power electrode 110, a plurality of vias 120 and a second power electrode 130. The circuit board 10 may be a single-layered or multi-layered circuit board and has an exposed first surface 11 and a second surface 12 opposite to the first surface 11.

The first power electrode 110 is disposed on the first surface 11 of the circuit board 10 and electrically connected to a device 20 (e.g., a resistor in the faun of a surface mounted device (SMD), a resistor or inductor, or a pin of a power integrated circuit (IC)) in a power circuit to receive a power signal SPOW provided by the power circuit. The second power electrode 130 is disposed on the second surface 12 of the circuit board 10 to electrically connect the integrated circuit 30. The vias 120 penetrate the circuit board 10 to electrically connect the first power electrode 110 and the second power electrode 130.

Figure 2:
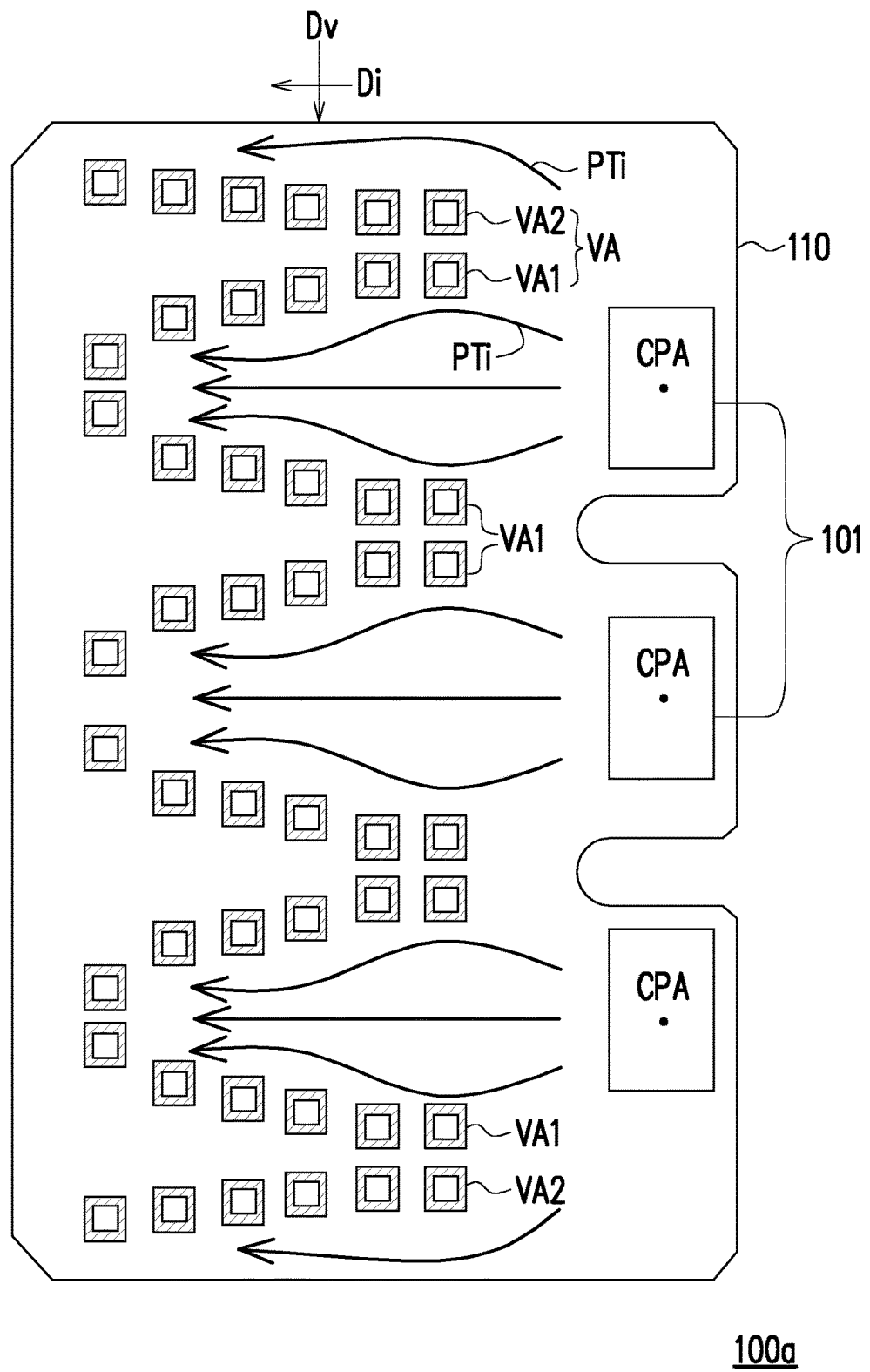
FIG. 2 is a schematic top view of a power signal transmission structure according to a first embodiment of the invention.

FIG. 2 is a schematic top view of a power signal transmission structure according to a first embodiment of the invention. Referring to FIGS. 1 and 2, in the embodiment, the first power electrode 110 of the power signal transmission structure 100a has a plurality of power pad regions 101. In addition, the power pad regions 101 are electrically connected to the device 20 to receive the power signal SPOW provided by the power circuit. In addition, the vias 120 of the power signal transmission structure 100a include, for example, a plurality of vias VA.

The vias VA are arranged based on a current direction Di of the power signal SPOW. In other words, from the view of the current direction Di of the power signal SPOW, the further the vias VA are away from the power pad regions 101, the less two adjacent vias VA are overlapped in the horizontal direction. Accordingly, the vias VA all receive a current of the power signal SPOW. In other words, an actual current path PTi passes through the respective vias VA to balance the current received by the vias VA. More specifically, the vias VA include a plurality of first vias VA1 and a plurality of second vias VA2. The first vias VA1 are arranged to form at least one arc with an opening toward central points CPA of the respective power pad regions 101. Furthermore, the first vias VA1 are arranged among the second vias VA2 with respect to a direction Dv perpendicular to the current direction Di, and the second vias VA2 and the first via VA1 form at least one W shape. The most distant vias VA in the W shape are aligned to the central points CPA of the respective power pad regions 101 while the closest vias VA of in the W shape are located by the outer sides of each of the power pad regions 101, perpendicular to the current direction Di.

In the embodiment, straight line distances (i.e., shortest distances) between the vias VA and the respective power pad regions 101 are different. However, in other embodiments, the straight line distances between the vias VA and the respective power pad regions 101 may be set to be the same. In other words, the horizontal positions of the vias VA may be adjusted correspondingly. The positions may be determined based on the numbers of the vias VA and the area of the first power electrode 110. The embodiments of the invention do not intend to impose a limitation on this regard.

Figure 3:
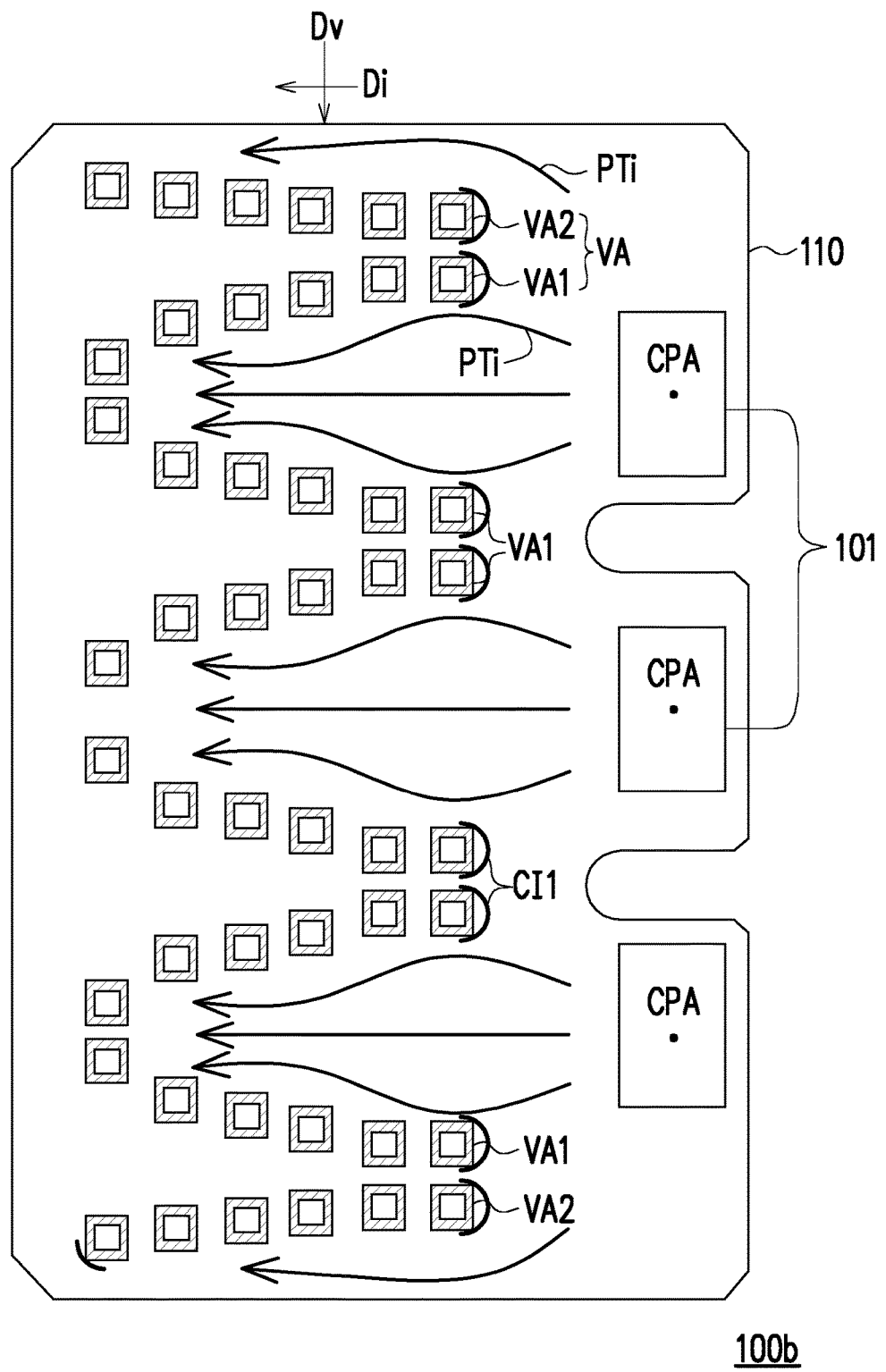
FIG. 3 is a schematic top view of a power signal transmission structure according to a second embodiment of the invention.

FIG. 3 is a schematic top view of a power signal transmission structure according to a second embodiment of the invention. Referring to FIGS. 1 to 3, in the embodiment, the first power electrode 110 of a power signal transmission structure 100b further includes a plurality of first conductor isolation rings CI1. In addition, the first conductor isolation rings CI1 surround some of the vias VA based on the current direction Di of the power signal SPOW. For example, the first conductor isolation rings CI1 individually surround the vias VA closest to the respective power pad regions 101 and are located between the respective vias VA that are surrounded and the respective power pad regions 101. In other words, the first conductor isolation rings CI1 are disposed on the rightmost vias VA to reduce the current flowing into the rightmost vias VA and thereby further balance the current of the vias VA.

In the embodiment, the first conductor isolation rings CI1 are disposed on the vias VA in the first column on the right. However, in other embodiments, the first conductor isolation rings CI1 may be disposed on the vias VA in the first two columns on the right, depending on the actual current path PTi. In other words, when the current flowing into the vias VA is excessively high (i.e., higher than a current threshold), the first conductor isolation rings CI1 are disposed to surround the vias VA, so as to reduce the current flowing into the vias VA. In addition, the current threshold may be related to the maximum current value of the power signal SPOW and/or the number of the vias VA.

Moreover, a surrounding ratio of the first conductor isolation rings CI1 to the vias VA may be proportional to the intensity of the current flowing into the vias VA. However, the first conductor isolation rings CI1 do not completely surround the vias VA. Alternatively, the intensity of the current flowing into the vias VA may be compared with the current threshold to determine the surrounding ratio of the first conductor isolation rings CI1 to the vias VA.

Moreover, in the embodiments of the invention, the first conductor isolation rings CI1 may be hollow patterns, or the first conductor isolation rings CI1 may be high-resistance conductors or insulators, depending on the circuit design. The embodiments of the invention do not intend to impose a limitation on this regard.

Figure 4:
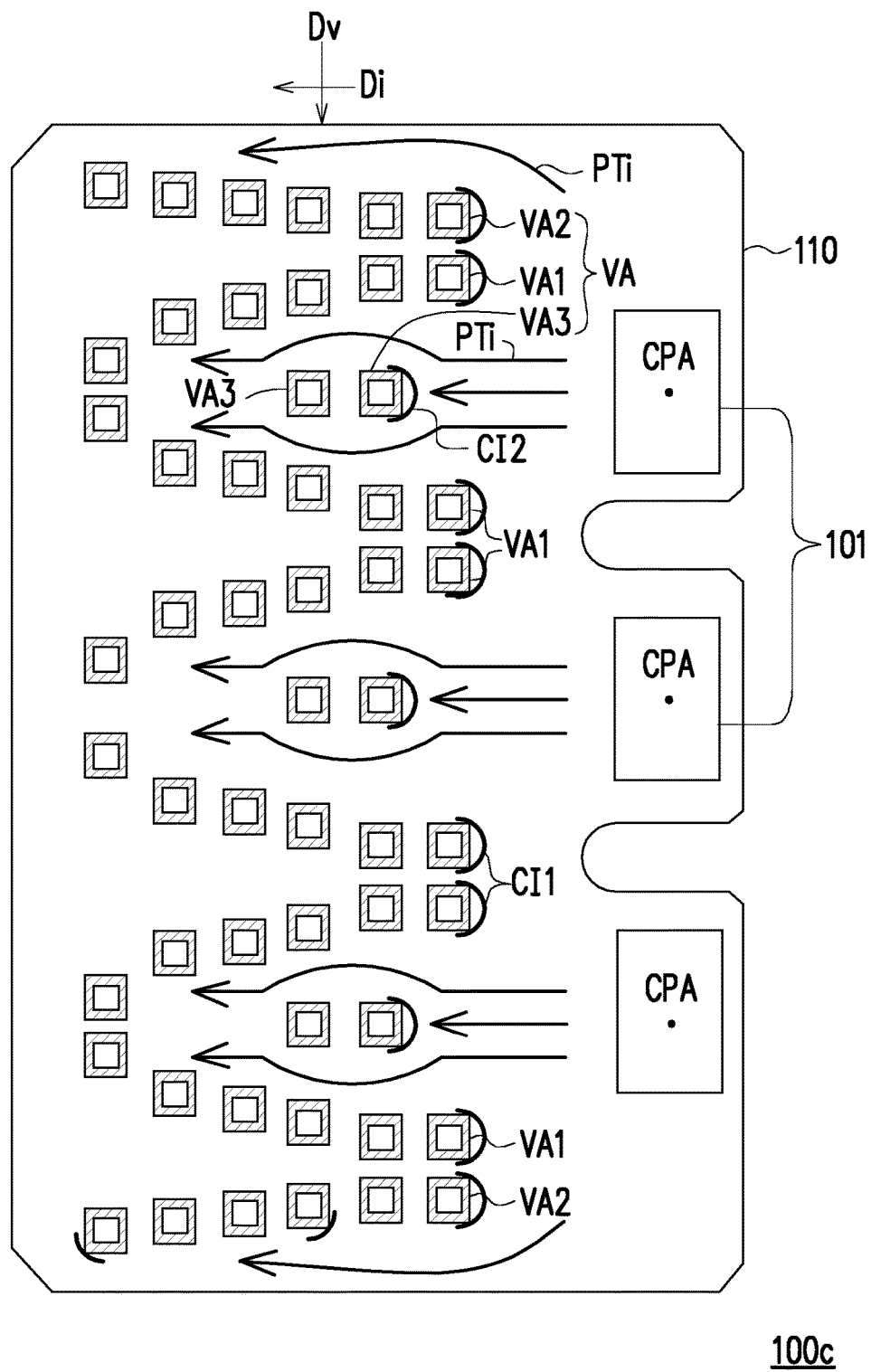
FIG. 4 is a schematic top view of a power signal transmission structure according to a third embodiment of the invention.

FIG. 4 is a schematic top view of a power signal transmission structure according to a third embodiment of the invention. Referring to FIGS. 1 to 4, in the embodiment, the first power electrode 110 of a power signal transmission structure 100c further includes a plurality of second conductor isolation rings CI2, and the vias 120 further include a plurality of third vias VA3.

The third vias VA3 are located in the at least one arc formed by the first vias VA1, and are aligned to the central points CPA of the respective power pad regions 101 along the current direction Di. In other words, the horizontal positions of the third vias VA3 are the same as the central point CPA of the corresponding power pad region 101. The second conductor isolation rings CI2 individually surround the respective third vias VA3 closest to the respective power pad regions 101, i.e., surrounding the rightmost third vias VA3, and are located between the surrounded third vias VA3 and the respective power pad regions 101.

In addition, a surrounding ratio of the second conductor isolation rings CI2 to the third vias VA3 may be proportional to the intensity of the current flowing into the third vias VA3. However, the second conductor isolation rings CI2 do not completely surround the third vias VA3. Alternatively, the intensity of the current flowing into the third vias VA3 may be compared with the current threshold (e.g., the embodiment shown in FIG. 3) to determine the surrounding ratio of the second conductor isolation rings CI2 to the third vias VA3. In the embodiments of the invention, the first conductor isolation rings CI1 and the second conductor isolation rings CI2 may both be hollow patterns, or the first conductor isolation rings CI1 and the second conductor isolation rings CI2 may both be high-resistance conductors or insulators, or the first conductor isolation rings CI1 and the second conductor isolation rings CI2 have different configurations, depending on the circuit design. The embodiments of the invention do not intend to impose a limitation on this regard.

Figure 5:
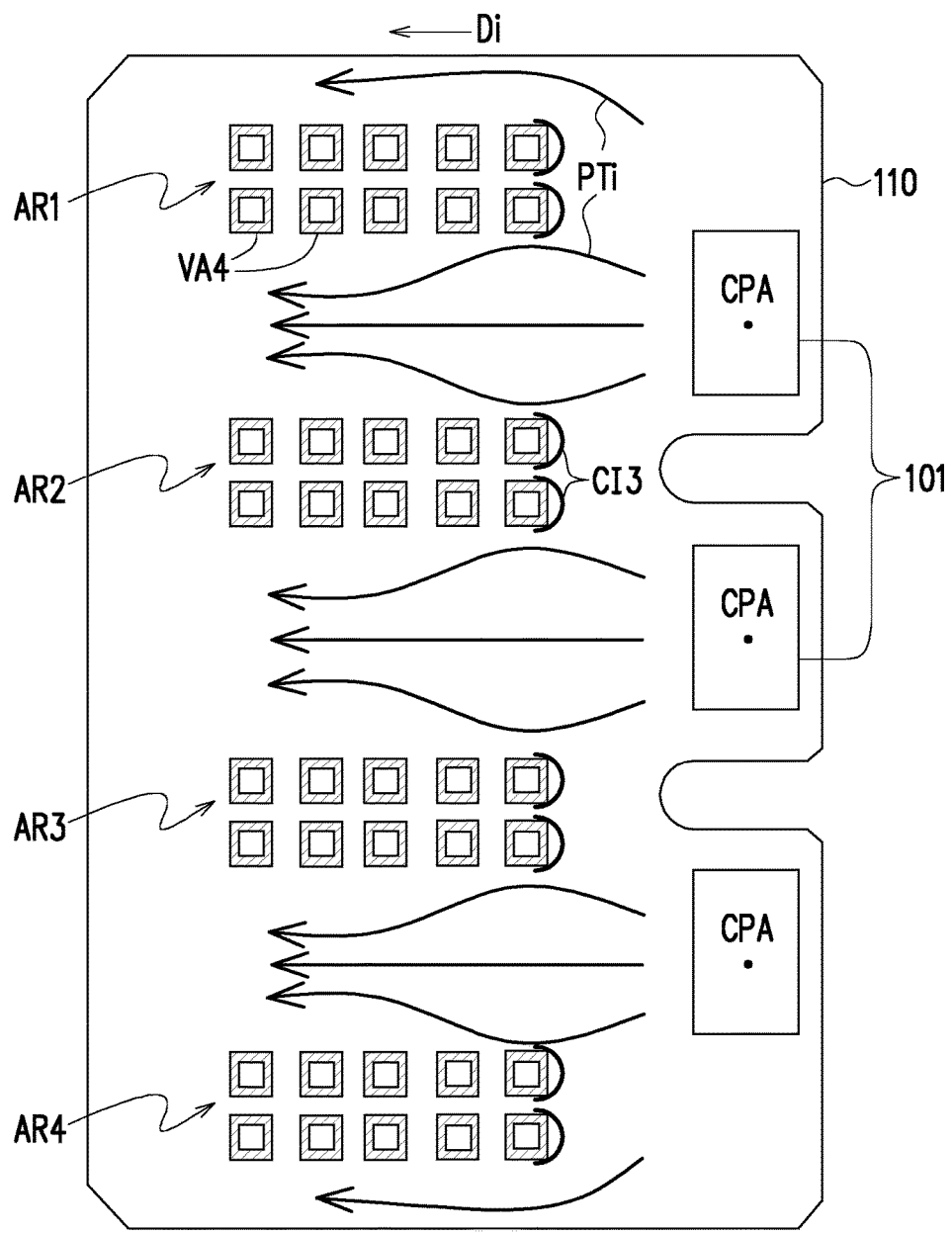
FIG. 5 is a schematic top view of a power signal transmission structure according to a fourth embodiment of the invention.

FIG. 5 is a schematic top view of a power signal transmission structure according to a fourth embodiment of the invention. Referring to FIGS. 1 and 5, in the embodiment, the first power electrode 110 of a power signal transmission structure 100d has the power pad regions 101 and a plurality of first conductor isolation rings CI3. Details regarding the power pad regions 101 may be referred to the embodiment of FIG. 2. In addition, the vias 120 of the power signal transmission structure 100d include, for example, a plurality of vias VA4.

In the embodiment, the vias VA4 are arranged in a plurality of arrays AR1 to AR4, and the power pad regions 101 are disposed between the arrays AR1 and AR4 along the current direction Di. In other words, the arrays AR1 and AR4 and the power pad regions 101 have different positions in the vertical direction. The first conductor isolation rings CI3 surround some of the vias VA4 based on the current direction Di of the power signal SPOW. In other words, the first conductor isolation rings CI3 individually surround the vias VA4 closest to the respective power pad regions (e.g., the first conductor isolation rings CI3 are disposed at the rightmost vias VA4). Moreover, the first conductor isolation rings CI3 are located between the respective vias VA4 that are surrounded and the respective power pad regions 101. Accordingly, the actual current path PTi may flow through the respective vias VA4 to balance the current received by the vias VA4.

In the embodiments of the invention, a surrounding ratio of the first conductor isolation rings CI3 to the vias VA4 may be proportional to the intensity of the current flowing into the vias VA4. However, the first conductor isolation rings CI3 do not completely surround the vias VA4. Alternatively, the intensity of the current flowing into the vias VA4 may be compared with the current threshold (e.g., the embodiment shown in FIG. 3) to determine the surrounding ratio of the first conductor isolation rings CI3 to the vias VA4.

In the embodiments of the invention, the first conductor isolation rings CI3 may be hollow patterns, or the first conductor isolation rings CI3 may be high-resistance conductors or insulators, depending on the circuit design. The embodiments of the invention do not intend to impose a limitation on this regard.

Figure 6:
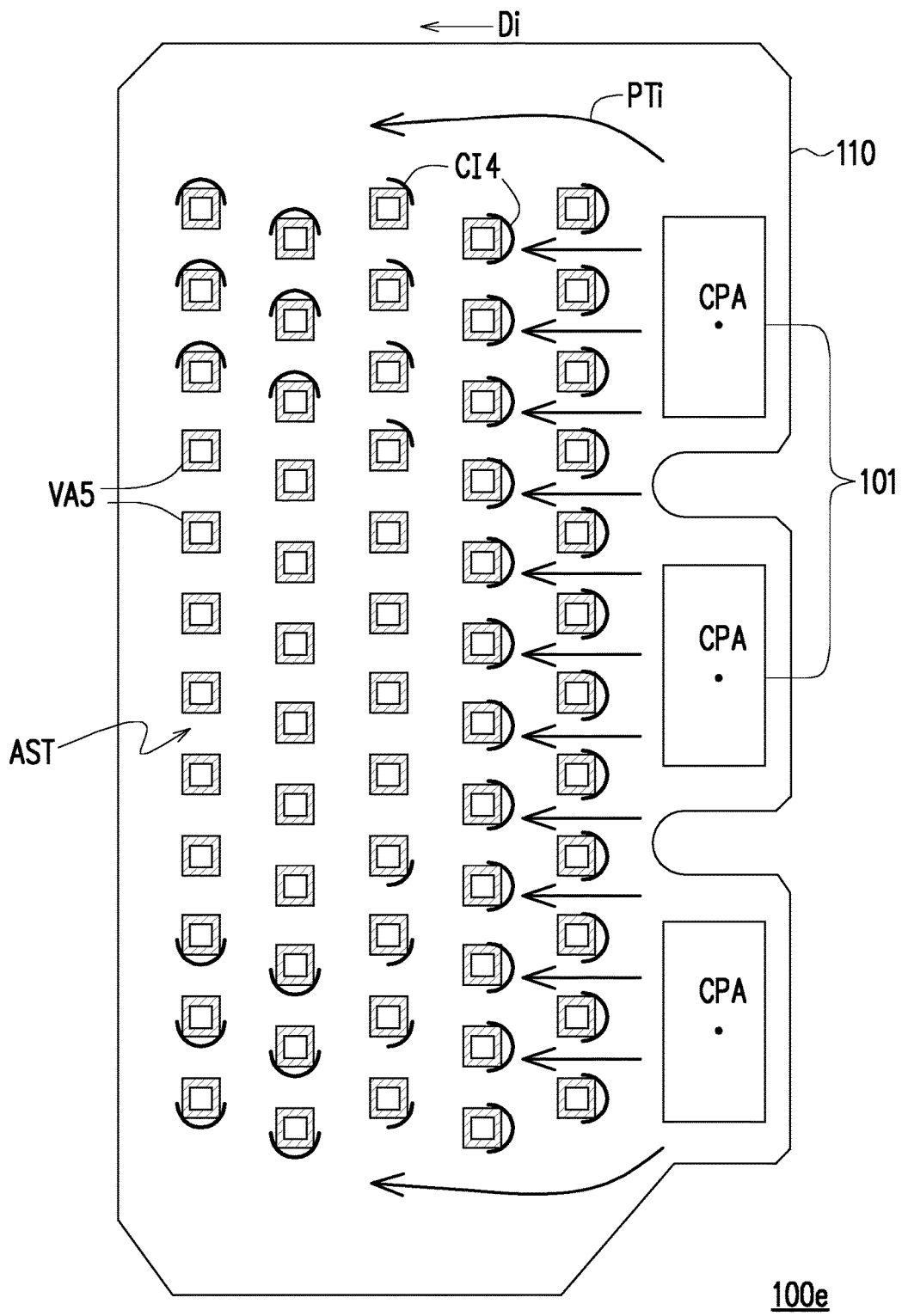
FIG. 6 is a schematic top view of a power signal transmission structure according to a fifth embodiment of the invention.

FIG. 6 is a schematic top view of a power signal transmission structure according to a fifth embodiment of the invention. Referring to FIGS. 1 and 6, in the embodiment, the first power electrode 110 of a power signal transmission structure 100e has the power pad regions 101 and a plurality of first conductor isolation rings CI4. Details regarding the power pad regions 101 may be referred to the embodiment of FIG. 2. In addition, the vias 120 of the power signal transmission structure 100e include, for example, a plurality of vias VA5.

The vias VA5 are arranged in a staggered array AST. The right side (corresponding to a first side) of the staggered array AST faces the power pad regions 101; the upper side and the lower side (corresponding to a second side and a third side) of the staggered array AST are more distant from the power pad regions 101; the left side of the staggered array AST is the most distant from the power pad regions 101. The first conductor isolation rings CI4 surround some of the vias VA5 based on the current direction Di of the power signal SPOW. In other words, the first conductor isolation rings CI4 surround the vias VA5 at the right side, the upper side, and the lower side of the staggered array AST. Accordingly, the actual current path PTi may flow through the respective vias VA5 to balance the current received by the vias VA5.

In the embodiments of the invention, a surrounding ratio of the first conductor isolation rings CI4 to the vias VA5 may be proportional to the intensity of the current flowing into the vias VA5. However, the first conductor isolation rings CI4 do not completely surround the vias VA5. Alternatively, the intensity of the current flowing into the vias VA5 may be compared with the current threshold (e.g., the embodiment shown in FIG. 3) to determine the surrounding ratio of the first conductor isolation rings CI4 to the vias VA5.

In the embodiments of the invention, the first conductor isolation rings CI4 may be hollow patterns, or the first conductor isolation rings CI4 may be high-resistance conductors or insulators, depending on the circuit design. The embodiments of the invention do not intend to impose a limitation on this regard.

Figure 7:
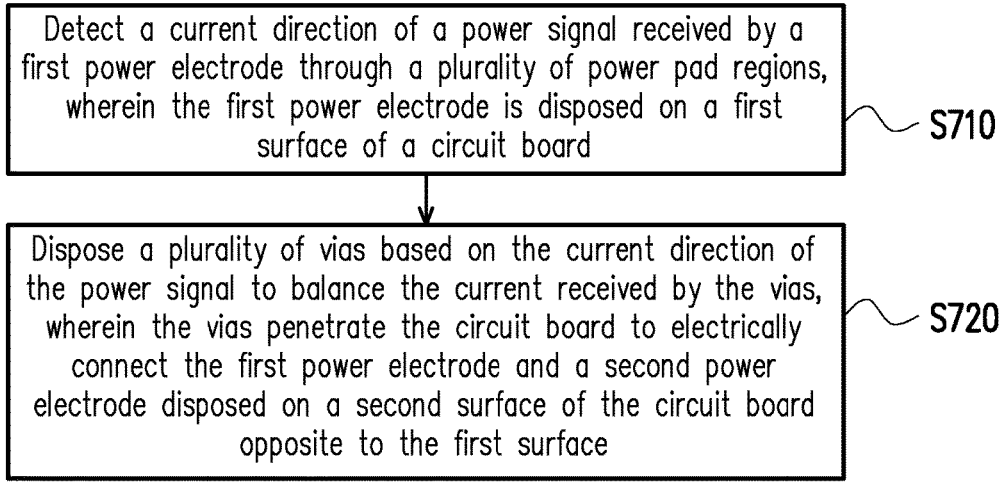
FIG. 7 is a flowchart of a design method of a power signal transmission structure according to an embodiment of the invention.

FIG. 7 is a flowchart of a design method of a power signal transmission structure according to an embodiment of the invention. Referring to FIG. 7, in the embodiment, the design method of the power signal transmission structure includes the following steps. At Step S710, a current direction of the power signal received by a first power electrode through a plurality of power pad regions is detected. The first power electrode is disposed on a first surface of a circuit board. In addition, at Step S720, a plurality of vias is disposed based on the current direction of the power signal to balance the current received by the vias. Moreover, the vias penetrate the circuit board to electrically connect the first power electrode and a second power electrode disposed on a second surface of the circuit board opposite to the first surface. The order of Step S710 and Step S720 is described above only for an illustrative purpose. The embodiments of the invention shall not be limited thereto. Moreover, details of Step S710 and Step S720 may be referred to the embodiments of FIGS. 1 to 4 and thus will not be repeated hereinafter.

Figure 8:
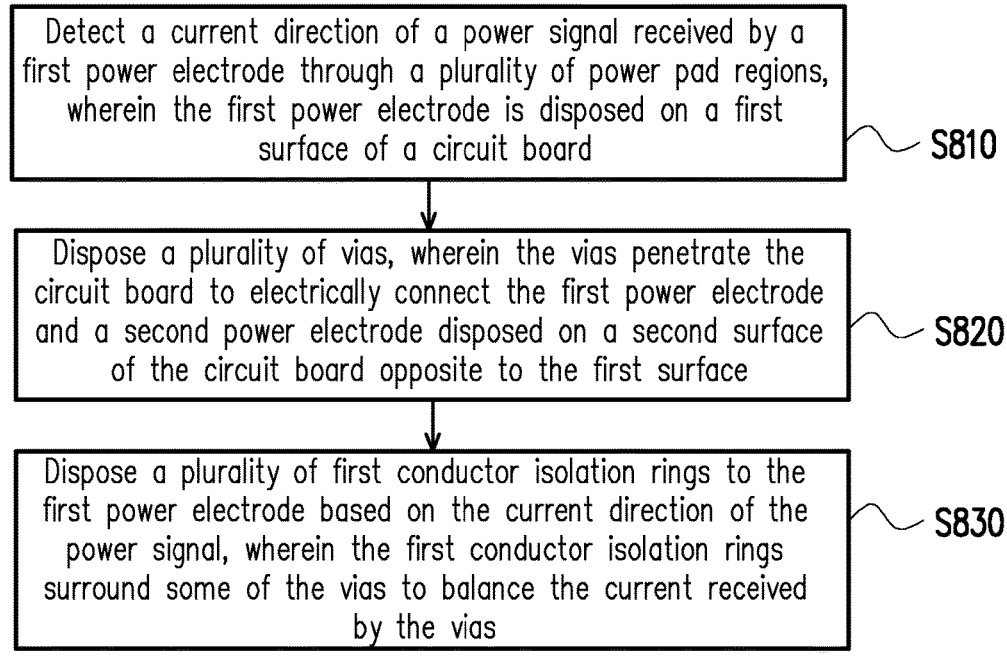
FIG. 8 is a flowchart of a design method of a power signal transmission structure according to another embodiment of the invention.

FIG. 8 is a flowchart of a design method of a power signal transmission structure according to another embodiment of the invention. Referring to FIG. 8, in the embodiment, the design method of the power signal transmission structure includes the following steps. At Step S810, a current direction of the power signal received by a first power electrode through a plurality of power pad regions is detected. The first power electrode is disposed on a first surface of a circuit board. Then, at Step S820, a plurality of vias is disposed. The vias penetrate the circuit board to electrically connect the first power electrode and a second power electrode disposed on a second surface of the circuit board opposite to the first surface. Then, at Step S830, a plurality of first conductor isolation rings is disposed to the first power electrode based on a current direction of the power signal. The first conductor isolation rings surround some of the vias to balance the current received by the vias.

The order of Step S810, Step S820 and Step S830 is described above only for an illustrative purpose, and the embodiments of the invention shall not be limited thereto. Moreover, details of Step S810, Step S820 and Step S830 may be referred to the embodiments of FIGS. 1 and 3 to 5 and thus will not be repeated hereinafter.

In the embodiments described above, terms such as "upper side", "lower side", "left side", "right side", "vertical", and "horizontal" are defined based on the orientations of the drawings and are only provided to facilitate the understanding of people having ordinary skill in the art to the drawings. Such terms shall not be construed as limitations of the embodiments of the invention. In other words, "upper side", "lower side", "left side" and "right side" are interchangeable without departing from the spirit of the invention, and "vertical" and "horizontal" are also interchangeable without departing from the spirit of the invention.

In view of the foregoing, in the power signal transmission structure and the design method of the power signal transmission structure according to the embodiments of the invention, the vias and/or the conductor isolation rings are disposed according to the current direction of the power signal, so as to balance the current received by the respective vias. Thus the respective vias are able to receive the current, and the current sharing by multiple vias is thus facilitated.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power signal transmission structure, adapted for a circuit board having a first surface and a second surface opposite to the first surface, the power signal transmission structure comprising:
    a first power electrode, disposed on the first surface and having a plurality of power pad regions for receiving a power signal;
    a second power electrode, disposed on the second surface; and
    a plurality of vias, penetrating the circuit board to electrically connect the first power electrode and the second power electrode, the vias arranged based on a current direction of the power signal to balance the current received by the vias; and
    a plurality of first conductor isolation rings individually surrounding the vias closest to the respective power pad regions, and the plurality of first conductor isolation rings located between the respective vias surrounded by the plurality of first conductor isolation rings and the respective power pad regions,
    wherein the vias comprise a plurality of first vias and a plurality of second vias, the first vias are arranged in arcs with openings toward central points of the respective power pad regions, the first vias are disposed among the second vias with respect to a direction perpendicular to the current direction, and the second vias and the first vias form a W shape.

2. The power signal transmission structure as claimed in claim 1, further comprising:
    a plurality of third vias, penetrating the circuit board to electrically connect the first power electrode and the second power electrode, located within the arcs formed by the first vias, and aligned to the central points of the respective power pad regions; and
    a plurality of second conductor isolation rings, individually surrounding the third vias closest to the respective power pad regions and located between the respective third vias surrounded by the second conductor isolation rings and the respective power pad regions.

3. The power signal transmission structure as claimed in claim 2, wherein each of the first conductor isolation rings and each of the second conductor isolation rings are hollow patterns.

* * * * *